(12) United States Patent
Zhao

(10) Patent No.: US 11,443,945 B2
(45) Date of Patent: Sep. 13, 2022

(54) MANUFACTURING METHOD FOR ARRAY SUBSTRATE

(71) Applicant: TCL CHINA STAR OPTOELECTRONICS TECHNOLOGY CO., LTD., Guangdong (CN)

(72) Inventor: Jinyang Zhao, Shenzhen (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 358 days.

(21) Appl. No.: 16/618,909

(22) PCT Filed: Nov. 12, 2019

(86) PCT No.: PCT/CN2019/117438
§ 371 (c)(1),
(2) Date: Dec. 3, 2019

(87) PCT Pub. No.: WO2020/215677
PCT Pub. Date: Oct. 29, 2020

(65) Prior Publication Data
US 2022/0005841 A1 Jan. 6, 2022

(30) Foreign Application Priority Data
Apr. 23, 2019 (CN) .......................... 201910327454.2

(51) Int. Cl.
*H01L 21/71* (2006.01)
*H01L 21/02* (2006.01)
(Continued)

(52) U.S. Cl.
CPC .. *H01L 21/02686* (2013.01); *H01L 21/02425* (2013.01); *H01L 21/02491* (2013.01);
(Continued)

(58) Field of Classification Search
CPC . H01L 27/1237; H01L 27/127; H01L 27/124; H01L 27/1214; H01L 27/3262;
(Continued)

(56) References Cited

U.S. PATENT DOCUMENTS

2020/0032028 A1 1/2020 Funderich et al.

FOREIGN PATENT DOCUMENTS

| CN | 1457225 A | 11/2003 |
|---|---|---|
| CN | 102495534 A | 6/2012 |

(Continued)

*Primary Examiner* — Shouxiang Hu
(74) *Attorney, Agent, or Firm* — Benesch, Friedlander, Coplan & Aronoff, LLP

(57) ABSTRACT

The present invention provides a manufacturing method of an array substrate, including steps of: providing a flexible substrate layer, forming a buffer layer, forming an active layer, forming a gate insulating layer, forming a gate layer, forming an interlayer insulating layer, forming a source and drain layer, forming an organic planarization layer, forming an anode layer. An array substrate manufactured by the above manufacturing method, and the array substrate includes laminated a flexible substrate layer, a buffer layer, an active layer, a gate insulating layer, a gate layer, an interlayer insulating layer, a source and drain layer, an organic planarization layer, and an anode layer, which are disposed in a stack.

6 Claims, 2 Drawing Sheets

(51) Int. Cl.
*H01L 27/12* (2006.01)
*H01L 21/20* (2006.01)
*H01L 21/77* (2017.01)
*H01L 21/768* (2006.01)

(52) U.S. Cl.
CPC .... *H01L 21/02675* (2013.01); *H01L 21/2026* (2013.01); *H01L 21/76894* (2013.01); *H01L 21/77* (2013.01); *H01L 27/127* (2013.01); *H01L 27/1237* (2013.01)

(58) Field of Classification Search
CPC .......... H01L 21/02675; H01L 27/1274; H01L 2227/323; H01L 2251/5369; H01L 21/76894; H01L 21/02686; H01L 21/77; H01L 21/02425; H01L 21/02491; H01L 21/2026; H01L 29/4908; B23K 26/046; B23K 26/0622; B23K 26/064
See application file for complete search history.

(56) References Cited

FOREIGN PATENT DOCUMENTS

| | | | | |
|---|---|---|---|---|
| CN | 107702829 A | 2/2018 | | |
| CN | 108563101 A | 9/2018 | | |
| CN | 108598087 A | 9/2018 | | |
| CN | 108633186 A | 10/2018 | | |
| CN | 109148529 A | 1/2019 | | |
| CN | 109148539 A | 1/2019 | | |
| CN | 109270798 A | 1/2019 | | |
| CN | 110137183 A | 8/2019 | | |
| DE | 102017106913 A1 | 10/2018 | | |
| KR | 2170133158 A | * 12/2017 | ............... | H05K 3/26 |
| KR | 101961378 B1 | 3/2019 | | |

\* cited by examiner

MANUFACTURING METHOD FOR ARRAY SUBSTRATE

FIELD OF INVENTION

The present invention is related to the field of display technology, and specifically, to an array substrate and a manufacturing method thereof.

BACKGROUND OF INVENTION

With development of technology, display devices are being developed in directions such as large-scale, high-definition, and high-functionality, so it is very important to improve the characteristics of products. As resolution and a screen size increase, a number of gate lines increases, a length of each of the gate lines increases, and a resistance of each of the gate lines increases. A gate drives input signals in sequence, and because the increasing resistance of each of the gate lines causes a problem of signal transmission delay, it is imperative to develop electrode materials with lower resistance. Copper has a higher electrical conductivity than conventional aluminum. When using a low-impedance wiring material, copper has a lower non-impedance value than aluminum, and considering the film thickness, copper has a lower cost than aluminum, so copper gradually becomes a main material required for thin-film transistor (TFT) electrodes.

Currently, copper TFT electrodes are mainly prepared by a photolithography technique, which includes physical vapor deposition (PVD) film formation, photoresist coating, photolithography, wet etching, and photoresist stripping, and is rather complicated. Moreover, the photolithography technique is a subtractive manufacturing technique, which causes more material waste. A laser direct writing technique as an additive manufacturing technique can directly prepare a patterned metal electrode structure from metal nanoparticles. This method is widely used in the field of micro/nano processing of polymer, gold, and silver nanoparticles. However, for copper nanoparticles, the laser direct writing technique easily causes copper to oxidize and decreases electrical conductivity thereof. In order to prevent copper from oxidation, there is a need to develop a novel laser direct writing technique to finely process copper electrodes required for TFTs.

Accordingly, there is a need to design a new array substrate and a manufacturing method thereof to overcome the defects in the prior art.

SUMMARY OF INVENTION

For those shortcomings and deficiencies of the prior art, the present invention provides an array substrate and a manufacturing method thereof, which use a direct writing technique of an ultra-high pulsed laser to melt copper nanoparticles and print a gate layer and a source and drain layer for the array substrate, thereby effectively reducing copper oxidation.

A purpose of the present invention is to provide a manufacturing method of an array substrate, including steps of:

providing a flexible substrate layer;

forming a buffer layer on the flexible substrate layer;

forming an active layer on the buffer layer, and patterning the active layer;

forming a gate insulating layer on the active layer;

forming a gate layer on the gate insulating layer by a method of using a pulsed laser to melt copper nanoparticles, wherein a wavelength of the pulsed laser ranges from 350 to 1064 nm;

forming an interlayer insulating layer on the gate layer;

forming a source and drain layer on the interlayer insulating layer;

forming an organic planarization layer on the source and drain layer; and forming an anode layer on the organic planarization layer to obtain the array substrate.

Furthermore, a scanning speed of the pulsed laser ranges from 5 to 10 mm/s for forming the gate layer.

Furthermore, forming the source and drain layer includes forming the source and drain layer on the interlayer insulating layer by the method of using the pulsed laser to melt the copper nanoparticles, and the wavelength of the pulsed laser ranges from 350 to 1064 nm.

Furthermore, a scanning speed of the pulsed laser ranges from 5 to 10 mm/s for forming the source and drain layer.

Furthermore, the pulsed laser is generated by a pulsed laser equipment.

Furthermore, the pulsed laser equipment includes a pulsed laser device, a filter, a beam correcting unit, a laser scanning unit, and a laser focusing unit disposed in sequence. Specifically, the pulsed laser device is for generating the pulsed laser. The filter is disposed at an exit port of the pulsed laser of the pulsed laser device, and the filter is used to pass the pulsed laser having a wavelength ranging from 350 to 1064 nm. The beam correcting unit is disposed on a side of the filter away from the pulsed laser device, and a central axis of the beam correcting unit coincides with a central axis of the pulsed laser. The laser scanning unit disposed on a side of the beam correcting unit away from the filter unit is for receiving and deflecting the pulsed laser. The laser focusing unit disposed at an exit port of the laser scanning unit is for focusing the pulsed laser.

Furthermore, a scanning speed of the pulsed laser is controlled by controlling a rotating speed of a galvanometer scanner of the laser scanning unit; and the scanning speed of the pulsed laser ranges from 5 to 10 mm/s.

A purpose of the present invention is to provide an array substrate manufactured by the above manufacturing method, and the array substrate includes a flexible substrate layer, a buffer layer, an active layer, a gate insulating layer, a gate layer, an interlayer insulating layer, a source and drain layer, an organic planarization layer, and an anode layer, which are disposed in a stack.

Furthermore, the source and drain layer is formed by a method of using a pulsed laser to melt copper nanoparticles; and a wavelength of the pulsed laser ranges from 350 to 1064 nm.

Furthermore, a scanning speed of the pulsed laser ranges from 5 to 10 mm/s.

The present invention has beneficial effects of providing an array substrate and a manufacturing method thereof. The present invention uses a direct writing technique of an ultra-high pulsed laser to melt copper nanoparticles and print a gate layer and a source and drain layer for the array substrate, thereby effectively reducing copper oxidation and simplifying the current processes and achieving fast production through direct printing.

Figure 1:
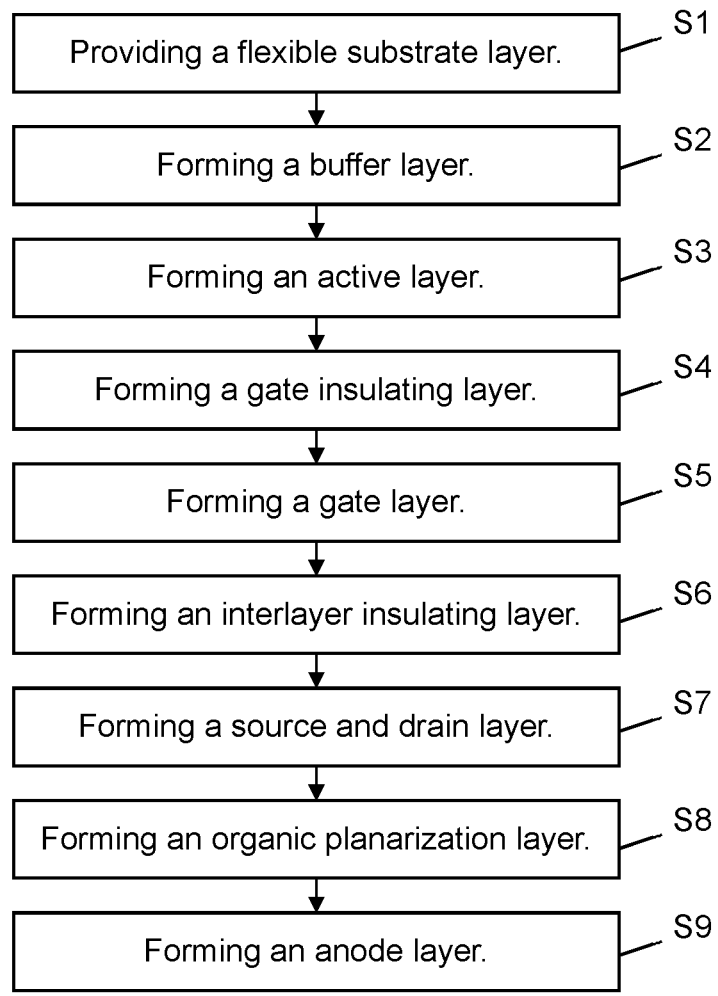
FIG. 1 is a manufacturing flowchart of an array substrate of one embodiment according to the present invention.

REFERENCE SIGNS array substrate 100, pulsed laser equipment 200, flexible substrate layer 1, buffer layer 2, active layer 3, gate insulating layer 4, gate layer 5, interlayer insulating layer 6, source and drain layer 7, organic planarization layer 8, anode layer 9, openings 61, pulsed laser device 31, filter 32, beam correcting unit 33, laser scanning unit 34, laser focusing unit 35, pulsed laser 36, copper nanoparticles 37, and substrate 38.

DETAILED DESCRIPTION OF PREFERRED EMBODIMENTS

Examples are described below with reference to the appended drawings, and the drawings illustrate particular embodiments in which the present invention may be practiced. Directional terms mentioned in the present invention, such as upper, lower, front, rear, left, right, in, out, side, etc., only refer to directions in the accompanying drawings. Thus, the adoption of directional terms is used to describe and understand the present invention, but not to limit the present invention. In the drawings, units of similar structures are represented using the same numerals.

Figure 2:
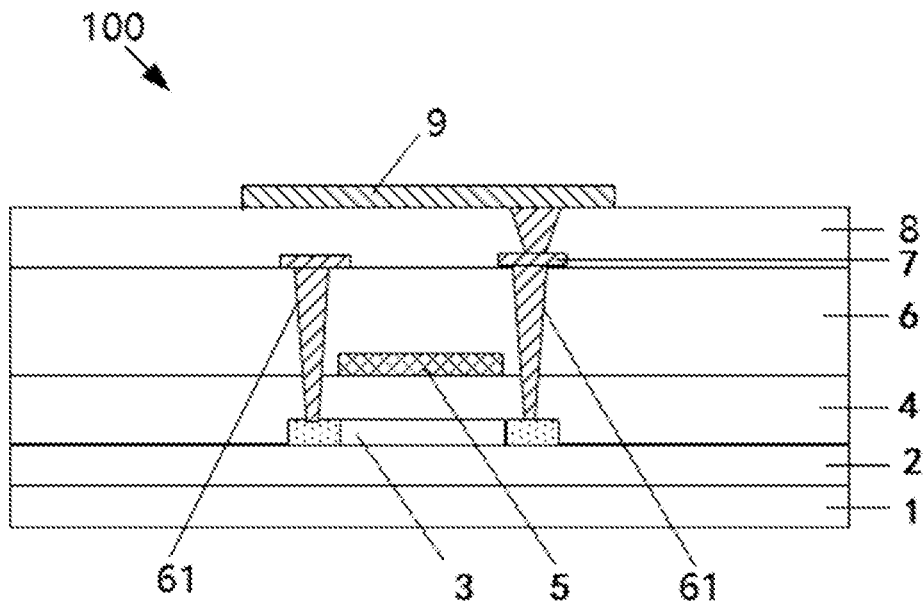
FIG. 2 is a structural diagram of an array substrate of one embodiment according to the present invention.

Please refer to FIGS. 1 and 2, a manufacturing method of an array substrate of one embodiment according to the present invention includes steps of:

S1, providing a flexible substrate layer 1;

S2, forming a buffer layer 2, the buffer layer 2 is formed on the flexible substrate layer 1;

S3, forming an active layer 3, the active layer 3 is formed on the buffer layer 2, and the active layer 3 is patterned;

S4, forming a gate insulating layer 4, the gate insulating layer 4 is formed on the active layer 3;

S5, forming a gate layer 5, the gate layer 5 is formed on the gate insulating layer 4 by a pulsed laser 36 melting of copper nanoparticles 37 method, and a wavelength of the pulsed laser 36 ranges from 350 to 1064 nm, and is preferably 350 nm, 400 nm, 550 nm, 600 nm, 800 nm, and 1064 nm;

S6, forming an interlayer insulating layer 6, the interlayer insulating layer 6 is formed on the gate layer 5;

S7, forming a source and drain layer 7, the source and drain layer 7 is formed on the interlayer insulating layer 6;

S8, forming an organic planarization layer 8, the organic planarization layer 8 is formed on the source and drain layer 7; and S9, forming an anode layer 9, the anode layer 9 is deposited on the organic planarization layer 8 to obtain the array substrate 100.

In this embodiment, in the step S7, forming a source and drain layer 7 specifically includes: forming openings 61 by photolithography, and forming the source and drain layer 7 by the pulsed laser 36 melting of the copper nanoparticles 37 method. The source and drain layer 7 fills the openings 61 and implements an electrically connection between the source and drain layer 7 and the active layer 3. The wavelength of the pulsed laser 36 ranges from 350 to 1064 nm, and is preferably 350 nm, 400 nm, 550 nm, 600 nm, 800 nm, and 1064 nm. The wavelength of the pulsed laser 36 of the present invention can be between 350 and 1064 nm, and is preferably selected to be a wavelength of 530 nm of the maximum absorption of the copper nanoparticles 37. In order to further improve the absorption efficiency, a wavelength of 1064 nm can be selected. Because of the two-photon effect, this wavelength has a higher absorption efficiency, which is more conducive to processing the copper nanoparticles 37.

In this embodiment, a scanning speed of the pulsed laser 36 ranges from 5 to 10 mm/s for forming the gate layer 5 and the source and drain layer 7, and is preferably 8 mm/s. A faster scanning speed of the pulsed laser 36 can reduce processing time and copper oxidation, but the faster scanning speed causes decreased processing accuracy. A suitable scanning speed of the pulsed laser 36 is 5 to 10 mm/s, and is preferably 8 mm/s, which can effectively prevent copper from oxidation and maintain the processing accuracy.

In this embodiment, the pulsed laser 36 is generated by a pulsed laser equipment 200. Please refer to FIG. 3, which shows the pulsed laser equipment 200 of one embodiment according to the present invention for generating the pulsed laser 36. The pulsed laser 36 can melt the copper nanoparticles 37 on a substrate 38. The wavelength of the pulsed laser 36 ranges from 350 to 1064 mm, and is preferably 350 nm, 400 nm, 550 nm, 600 nm, 800 nm, and 1064 nm. The scanning speed of the pulsed laser 36 ranges from 5 to 10 mm/s, and is preferably 8 mm/s.

Figure 3:
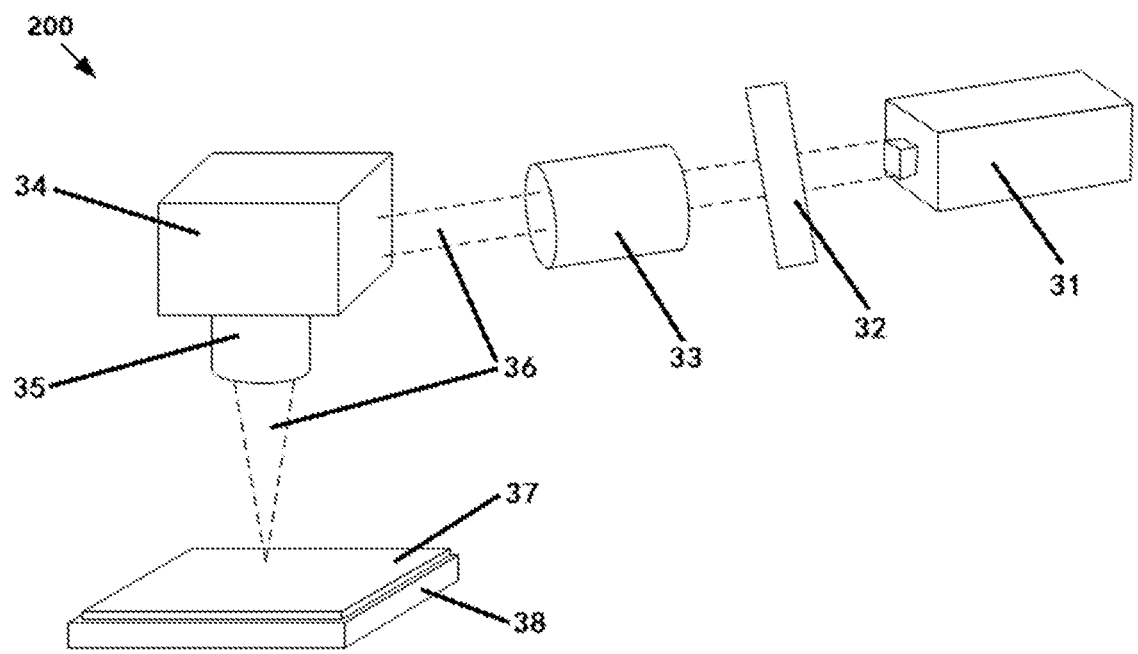
FIG. 3 is a structural diagram of a pulsed laser equipment of one embodiment according to the present invention.

Please refer to FIG. 3, the pulsed laser equipment 200 includes a pulsed laser device 31, a filter 32, a beam correcting unit 33, a laser scanning unit 34, and a laser focusing unit 35 disposed in sequence. Specifically, the pulsed laser device 31 is for generating the pulsed laser 36, which is preferably a femtosecond or nanosecond laser. The filter 32 is disposed at an exit port of the pulsed laser 36 of the pulsed laser device 31, and the filter 32 is used to pass the pulsed laser 36 having a wavelength ranging from 350 to 1064 nm. The pulsed laser 36 can filter out stray light through the filter 32 to ensure its purity. The beam correcting unit 33 is disposed on a side of the filter 32 away from the pulsed laser device 31, and a central axis of the beam correcting unit 33 coincides with a central axis of the pulsed laser 36. The beam correcting unit 33 trims the pulsed laser 36 to make light energy distribution more uniform. The laser scanning unit 34 disposed on a side of the beam correcting unit 33 away from the filter 32 unit is for receiving and deflecting the pulsed laser 36. The laser scanning unit 34 can implement a fast scanning of the pulsed laser 36, and a scanning speed of the pulsed laser 36 ranges from 5 to 10 mm/s. The laser focusing unit 35 disposed at an exit port of the laser scanning unit 34 is for focusing the pulsed laser 36. The laser focusing unit 35 focuses the pulsed laser 36 on the substrate to process copper nanoparticles. In order to pattern copper electrodes (referring to the gate layer 5 or the source and drain layer 7), this can be implemented by the laser scanning unit 34 and moving the substrate.

The present invention uses the femtosecond or nanosecond laser as a laser light source, and a wavelength thereof is between 350 and 1064 nm, and is preferably selected to be a wavelength of 530 nm of the maximum absorption of the copper nanoparticles 37. In order to further improve the absorption efficiency, a wavelength of 1064 nm can be selected. Because of the two-photon effect, this wavelength has a higher absorption efficiency, which is more conducive to process the copper nanoparticles 37. A faster scanning speed of the pulsed laser 36 can reduce processing time and copper oxidation, but the faster scanning speed causes decreased processing accuracy. A suitable scanning speed of the pulsed laser 36 is 5 to 10 mm/s, which can effectively prevent copper from oxidation and maintain the processing accuracy.

The laser scanning unit 34 uses a galvanometer scanner with a fast rotating speed to implement a fast scanning of a laser beam and controls a scanning angle of the galvanometer scanner to scan the laser beam according to a specific path, thereby obtaining a specific pattern of the copper electrodes (referring to the gate layer 5 or the source and drain layer 7). The scanning speed is controlled by controlling the rotating speed of the galvanometer scanner, which can reach 100 mm/s. Accordingly, the scanning speed of the pulsed laser 36 ranges from 5 to 100 mm/s, and is preferably the scanning speed of the pulsed laser 36 ranges from 5 to 10 mm/s.

In a process of forming the copper electrodes (referring to the gate layer 5 or the source and drain layer 7), the copper nanoparticles 37 are mixed to form copper nanoparticle ink first. The copper nanoparticle ink is formed into a film layer of a desired thickness on the substrate 38 by spin coating or blade coating and heated under air at 60 degrees for 10 minutes to remove the solvent. The high energy pulsed laser 36 is focused onto the film layer of copper, and a regional thermal field generated by the pulsed laser 36 is used to melt the copper nanoparticles 37 to aggregate and solidify the copper nanoparticles 37. This method melts and aggregates the copper nanoparticles 37 in a very short time, so that the copper nanoparticles 37 are aggregated without being oxidized. It effectively prevents the copper nanoparticles 37 from oxidation, which is advantageous for obtaining high conductivity copper electrodes (referring to the gate layer 5 or the source and drain layer 7). The substrate 38 or the pulsed laser 36 is moved in the specific path to obtain a correspondingly pattern. A film layer of uncured copper nanoparticles is washed away by using a solvent such as chlorobenzene, so that the substrate 38 has the required pattern of the copper electrodes (referring to the gate layer 5 or the source and drain layer 7). Washed copper nanoparticles can also be recycled, which can effectively prevent material waste.

Dimensional accuracy of the copper electrodes (referring to the gate layer 5 or the source and drain layer 7) can be adjusted by changing laser power and focusing size. After the laser power exceeds threshold power of copper melting, as the laser power increases, the minimum line width that can be obtained by laser processing becomes greater, while processing accuracy becomes lower, but processing time becomes shorter. Accordingly, for samples with low accuracy requirements, the processing time can be saved by increasing the laser power. Likewise, the larger the focusing size, the minimum line width that can be obtained by laser processing becomes greater, while processing accuracy becomes lower. Therefore, in order to obtain a structure with high accuracy copper electrodes (referring to the gate layer 5 or the source and drain layer 7), it is necessary to use a suitable laser power and a focusing size as small as possible.

The present invention uses a direct writing technique of a pulsed laser to from copper electrodes (referring to the gate layer 5 or the source and drain layer 7), which is a simple and convenient process that saves materials, and has high processing accuracy and controllable morphology, and can reduce copper oxidation effectively, which is favorable for obtaining high conductivity copper electrodes (referring to the gate layer 5 or the source and drain layer 7). Moreover, an influence on the substrate 38 is small, and it can be applied to various substrates 38, and can also be used for preparation of a device of a flexible array substrate 100.

Please refer to FIG. 2, an array substrate 100 of one embodiment according to the present invention is manufactured by the above manufacturing method. The array substrate 100 includes a flexible substrate layer 1, a buffer layer 2, an active layer 3, a gate insulating layer 4, a gate layer 5, an interlayer insulating layer 6, a source and drain layer 7, an organic planarization layer 8, and an anode layer 9, which are disposed in a stack.

In this embodiment, the source and drain layer 7 is formed by the method of using the pulsed laser 36 to melt the copper nanoparticles 37. The wavelength of the pulsed laser 36 ranges from 350 to 1064 nm, and is preferably 350 nm, 400 nm, 550 nm, 600 nm, 800 nm, and 1064 nm. The wavelength of the pulsed laser 36 of the present invention can be between 350 and 1064 nm, and is preferably selected to be a wavelength of 530 nm of the maximum absorption of the copper nanoparticles 37. In order to further improve the absorption efficiency, a wavelength of 1064 nm can be selected. Because of the two-photon effect, this wavelength has a higher absorption efficiency, which is more conducive to processing the copper nanoparticles 37.

In this embodiment, a scanning speed of the pulsed laser 36 ranges from 5 to 10 mm/s for forming the gate layer 5 and the source and drain layer 7, and is preferably 8 mm/s. A faster scanning speed of the pulsed laser 36 can reduce processing time and copper oxidation, but the faster scanning speed causes decreased processing accuracy. A suitable scanning speed of the pulsed laser 36 is 5 to 10 mm/s, and is preferably 8 mm/s, which can effectively prevent copper from oxidation and maintain the processing accuracy.

The present invention has beneficial effects of providing an array substrate 100 and a manufacturing method thereof. The present invention uses a direct writing technique of an ultra-high pulsed laser to melt copper nanoparticles and print a gate layer 5 and a source and drain layer 7 for the array substrate 100, thereby effectively reducing copper oxidation and simplifying the current processes and achieving fast production through direct printing.

Although the present invention has been disclosed above by the preferred embodiments, the preferred embodiments are not intended to limit the invention. One of ordinary skill in the art, without departing from the spirit and scope of the present invention, can make various modifications and variations of the present invention. Therefore, the scope of the claims to define the scope of equivalents.

What is claimed is:

1. A manufacturing method of an array substrate, comprising steps of:

providing a flexible substrate layer;

forming a buffer layer on the flexible substrate layer;

forming an active layer on the buffer layer, and patterning the active layer;

forming a gate insulating layer on the active layer;

forming a gate layer on the gate insulating layer by using a pulsed laser to melt copper nanoparticles, wherein a wavelength of the pulsed laser ranges from 350 to 1064 nm, and a scanning speed of the pulsed laser ranges from 5 to 10 mm/s;

forming an interlayer insulating layer on the gate layer and defining openings in the interlayer insulating layer;

patterning a source and drain layer on the interlayer insulating layer and in the openings;

forming an organic planarization layer on the source and drain layer; and forming an anode layer on the organic planarization layer to obtain the array substrate.

2. The manufacturing method of the array substrate according to claim 1, wherein the source and drain layer is patterned by using the pulsed laser to melt the copper nanoparticles, and the wavelength of the pulsed laser ranges from 350 to 1064 nm.

3. The manufacturing method of the array substrate according to claim 2, wherein a scanning speed of the pulsed laser ranges from 5 to 10 mm/s for forming the source and drain layer.

4. The manufacturing method of the array substrate according to claim 1, wherein the pulsed laser is generated by a pulsed laser equipment.

5. The manufacturing method of the array substrate according to claim 4, wherein the pulsed laser equipment comprises:

a pulsed laser device for generating the pulsed laser;

a filter disposed at an exit port of the pulsed laser of the pulsed laser device, wherein the filter is used to pass the pulsed laser having the wavelength ranging from 350 to 1064 nm;

a beam correcting unit disposed on a side of the filter away from the pulsed laser device, wherein a central axis of the beam correcting unit coincides with a central axis of the pulsed laser;

a laser scanning unit disposed on a side of the beam correcting unit away from the filter unit for receiving and deflecting the pulsed laser; and a laser focusing unit disposed at an exit port of the laser scanning unit for focusing the pulsed laser.

6. The manufacturing method of the array substrate according to claim 5, wherein the scanning speed of the pulsed laser is controlled by controlling a rotating speed of a galvanometer scanner of the laser scanning unit.

* * * * *